United States Patent [19]

Takakura

[11] Patent Number: 5,253,006
[45] Date of Patent: Oct. 12, 1993

[54] MOVING-UNIT TYPE DEVELOPING METHOD AND A MOVING-UNIT TYPE DEVELOPING APPARATUS

[75] Inventor: Kouichi Takakura, Chiba, Japan

[73] Assignee: Think Laboratory Co., Ltd., Chiba, Japan

[21] Appl. No.: 702,946

[22] Filed: May 20, 1991

[30] Foreign Application Priority Data

May 24, 1990 [JP] Japan .................. 2-136494

[51] Int. Cl.$^5$ .................. G03D 5/00; G03D 3/04
[52] U.S. Cl. .................. 354/317; 354/330
[58] Field of Search .................. 354/319–324, 354/317, 329, 330; 134/158, 159, 79

[56] References Cited

U.S. PATENT DOCUMENTS 3,559,558  2/1971  Hamlin et al. .................. 354/330

Primary Examiner—D. Rutledge
Attorney, Agent, or Firm—Koda and Androlia

[57] ABSTRACT

A developing method and apparatus for performing a multi-treatment that comprises developing, washing, and drying a roll which is to be made into a printing plate. The treatments are performed by a single developing unit that includes a developing solution apply brush, a solution wash-away brush and a wash water suction-remover which are mounted on a horizontally and vertically movable table in the order of treatment so that these component come into contact with the rotating roll and successively perform the multi-treatment while they are rotated.

4 Claims, 4 Drawing Sheets

MOVING-UNIT TYPE DEVELOPING METHOD AND A MOVING-UNIT TYPE DEVELOPING APPARATUS

BACKGROUND OF THE INVENTION

1. Field of the Invention

The present invention relates to a moving-unit type developing method and an apparatus for performing the method.

2. Prior Art

In prior art, a device wherein a single developing unit is moved along under side of a roll (which is to be made into a printing plate) so as to successively perform a heat treatment (which accelerates a setting reaction of exposed portions of photosensitive film on the roll), an alkali developing treatment, a washing treatment and a drying treatment onto the roll has not been known on the market.

Conventional developing and treatments before and after developing are performed in the following manner: first, a roll that is to be made into a printing plate is left as is for approximately 30 minutes after exposure so as to promote a setting reaction of exposed areas on the photosensitive film. Then, an alkali developing treatment, that uses alkali solutions, is performed onto the roll via a shower type alkali developing device, the roll is washed via a shower type washing device so as to remove alkali solutions. After this, the water used for the washing and adhering to the surface of the roll is cleaned manually.

However, such a conventional developing technique has some problems: (1) The entire apparatus line occupies a large space. (2) Many number of component devices are required, which results in the manufacturing costs proportionally high. (3) The shower type alkali developing treatment causes fringe area to be larger, approximately 10 microns. (4) If a plurality of rolls that are to be made into printing plates are distributed to respective component devices and treated thereby, it is difficult to control the processing time of each device. (5) When one roll plate has gone through one treatment step (e.g., alkali developing treatment) and sent to the next treatment step (e.g., washing treatment), a development destabilization may occur if the plate roll needs to wait for treatment because of the next processing means (washing device) that is engaged in its own treatment process onto the previously provided roll. (6) A cleaning step to remove the washing water is inevitable.

SUMMARY OF THE INVENTION

Accordingly, a primary object of the present invention is to provide a moving-unit type developing method and an apparatus therefor which performs a multi-treatment, that comprises of (a) developing, (b) washing after the devolving, and (c) drying after the washing, onto a roll that is to be made into a printing plate on which desired information has been exposed following a coating process of the roll surface with a photosensitive film (called "plate roll"). With such a method and apparatus, an etching treatment can be performed immediately thereafter.

It is another object of the present invention to provide a moving-unit type developing apparatus which performs the moving-unit type developing method that achieves a rub-in application of alkali developing solution by bringing fine bristles into rubbing-contact with the plate roll so that an alkali developing solution effectively permeates the photosensitive film of the plate roll, thus reducing the fringe area to be approximately 10 microns.

It is a further object of the present invention to provide a moving-unit type developing method and apparatus in which a multi-treatment that consists of pre-developing heating, developing, washing after the developing, and drying after the washing is performed without waiting for setting-reaction after the exposure which was required in conventional system.

In order to accomplish the objects, in the method of the present invention:

(a) a plate roll is first chucked at both ends in a horizontal position and rotated, and (b) a developing unit, which comprises a developing means, a washing means, and a drying means (which are arranged in the order of treatment; in other words in such an order as listed), is positioned beneath the plate roll and moved from one end to the other of the underside of the plate roll. With this plate roll position and the developing unit position, (1) an alkali developing treatment is performed by bringing a first roll brush of the developing means into contact with the plate roll and rotated while the brush is immersed in an alkali developing solution, (2) after the alkali developing treatment, a treatment to wash the alkali developing solution and dissolved resists remaining on the plate roll is performed by bringing a second roll brush of the washing means into contact with the plate roll and rotated while the brush is sprayed with wash water, and (3) after the washing, the plate roll is dried by bringing a sponge roll of the moisture-removing means into contact with the plate roll so as to suction-remove the wash water off the plate via vacuum.

Furthermore, the moving-unit type developing apparatus of the present invention comprises:

(a) a roll chucking means which holds a plate roll (that is to be made into a printing plate on which desired information has been exposed following the coating of the roll surface with a photosensitive film) horizontally and rotates it, (b) a table which moves horizontally and vertically in a predetermined order between one end to the other under the roll-plate held by the roll-chucking means;

(c) a developing unit installed on the table, the developing unit comprising a developing means, a washing means, and a moisture-removing means (which are installed in the order of treatment thereby; in other words, in such an order as listed) along an axis of the plate roll; wherein:

(c-1) the developing means includes a first roll brush which is made of fine bristles implanted at a predetermined high density and is immersed in an alkali developing solution storage, (c-2) the washing means includes a second roll brush which is made of fine bristles implanted at a predetermined high density and sprayed with wash water supplied via a flexible hose, and (c-3) the moisture-removing means includes a sponge roll having rotatable annular sponge covering the outside of a porous tube, and a negative pressure generating means is connected to the sponge roll so as to bring the inside of the sponge roll under a negative pressure.

By means of the structure described above,

When the table is moved upward to a predetermined height and then moved horizontally along the undersurface of the roll, (1) the first roll brush of the developing means is rotated in the opposite direction from the rotational direction of the plate roll so that the first roll brush, that is rotating, is brought into contact with the plate roll and applies an alkali developing solution onto the surface of the plate roll, thus performing an alkali developing process;

(2) the second roll brush of the washing means next to the developing means is also rotated in the opposite direction from the rotational direction of the plate roll so that the second roll brush, that is rotating, is brought into contact with the plate roll and washes off the alkali developing solution and dissolved resists remaining on the developed areas of the plate; and (3) the sponge roll of the moisture-removing means is brought into contact with the plate roll and rotated thereby, so that the wash water adhering to the washed area of the plate roll is removed by suction.

Thus, developing and treatments after the developing can be performed by a single unit of developing device, eliminating drawbacks seen in the prior art developing technique.

DETAILED DESCRIPTION OF THE INVENTION

Figure 1:
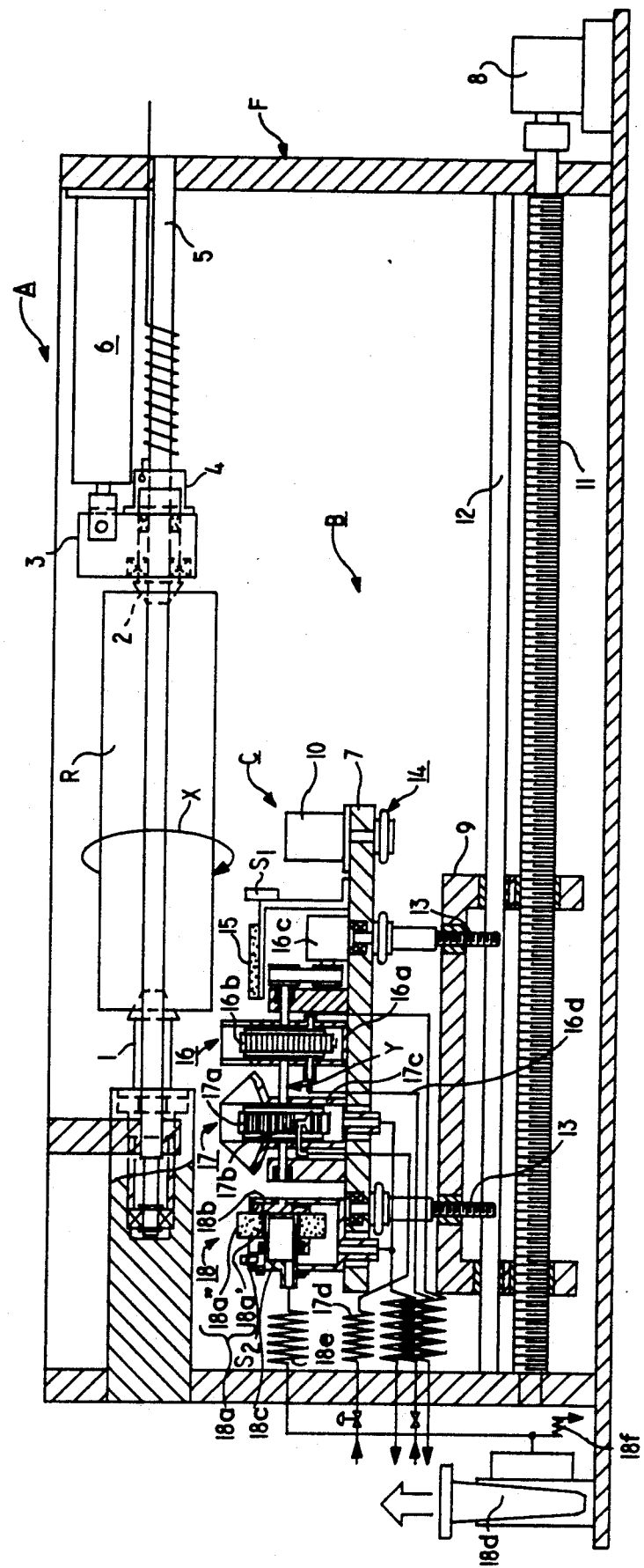
FIG. 1 is a longitudinal cross sectional front view of the moving-unit type developing apparatus of one embodiment of the present invention, especially showing an initial step of the developing process.
Figure 2:
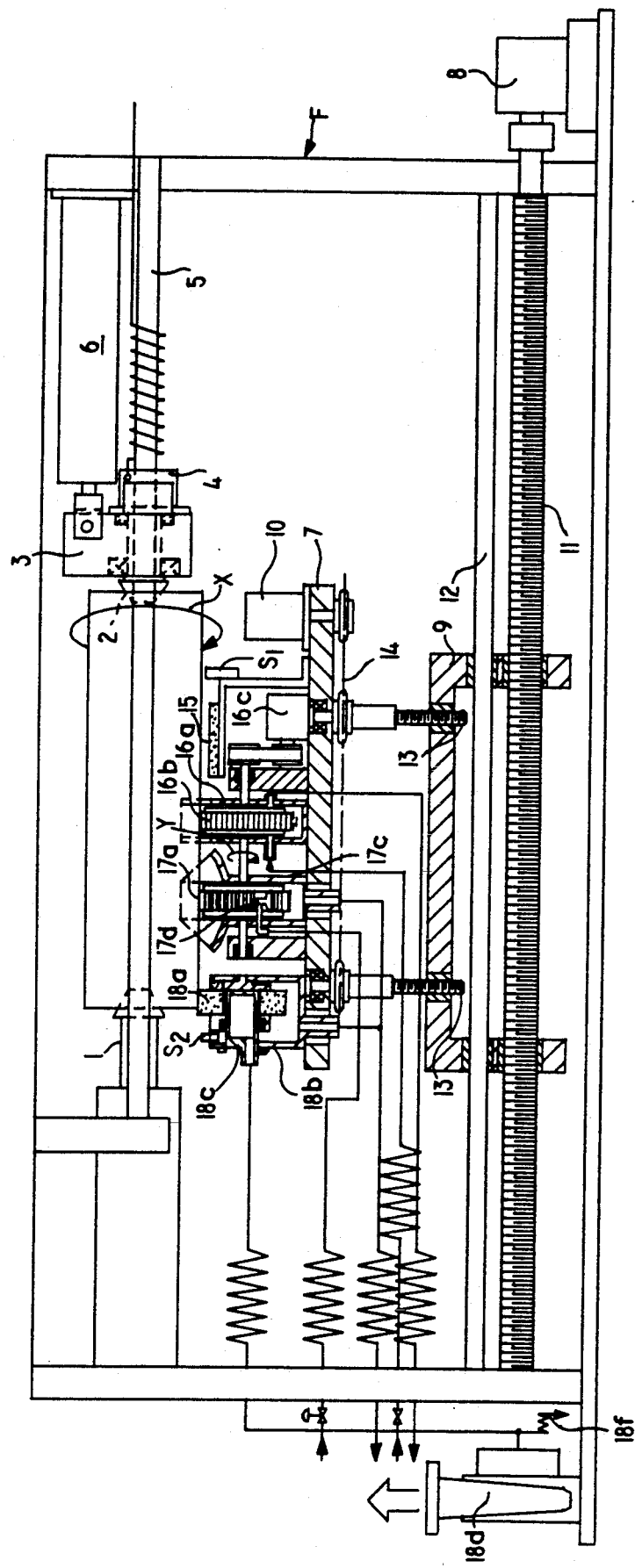
FIG. 2 is a longitudinal cross sectional view thereof, showing the mid stage of the developing process.
Figure 3:
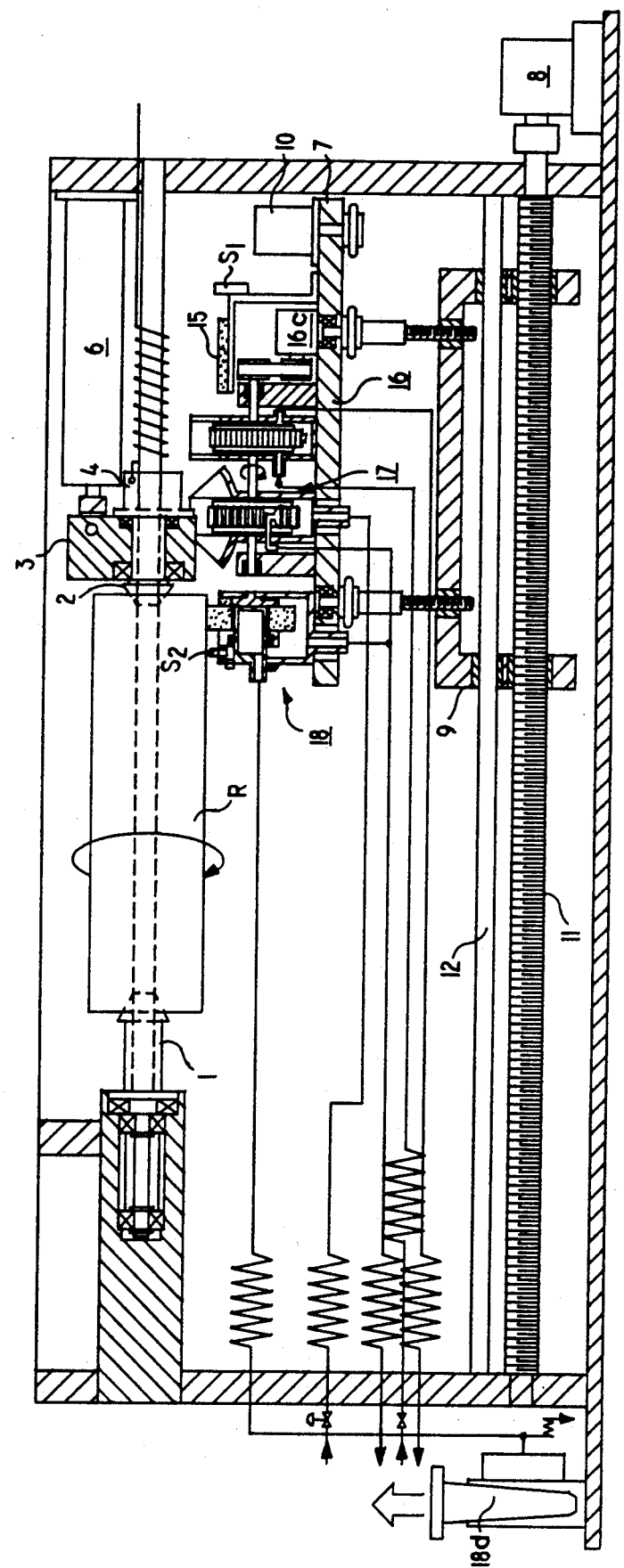
FIG. 3 is a longitudinal cross sectional front view thereof, showing the completion of the developing process.

FIGS. 1 through 3 illustrate a first embodiment of the moving-unit type developing apparatus according to the present invention. This apparatus also constitutes one practical example of the use of moving-unit type developing method provided by the present invention.

First, the structure of the apparatus will be described:

In this embodiment, a roll-chucking means A is installed in the upper portion of a framework F, and a two-dimensional table apparatus B is installed in the lower portion of the framework F. Also, a developing unit C is provided on the table apparatus B.

The roll-chucking means A includes a fixed-side rotary chuck 1 and a movable-side rotary chuck 2 which face each other in the axial direction. The movable-side rotary chuck 2 is pivot supported on a movable bearing block 3, and a chuck motor 4 which rotates the movable-side rotary chuck 2 is provided on the movable bearing block 3. The movable bearing block 3 is engaged with and guided by a horizontal guide 5 that is used for chucking and is moved via an air cylinder 6 installed in the framework F.

The thus structured roll-chucking means A operates as follows: A plate roll R that is to be made into a printing plate is positioned horizontally between the chucks 1 and 2, and the air cylinder 6 is actuated to extend after one end of the roll R is engaged with the fixed-side rotary chuck 1. Then, the movable bearing block 3 is moved in the chucking direction so that the movable-side rotary chuck 2 is brought into engagement with the other end of the plate roll R. Thus, the roll R is chucked at both ends horizontally. When the chuck motor 4 is driven, the plate roll R is rotated at a predetermined speed.

The two-dimensional table apparatus B is a table 7 which is movable a predetermined distance in one or both of horizontal and vertical directions in accordance with the length and diameter, respectively, of the plate roll R. For the sake of simplicity the table 7 shall be hereinafter called the two-dimensional table 7. The specific structure of the table apparatus B can vary as long as it can make the horizontal and vertical movement as described above.

The two-dimensional table 7 is freely raised and lowered by a motor 10 which is installed on the table 7. The table 9 that supports the table 7 thereon as described below is freely moved by a motor 8 that is for making a horizontal table movement. Thus, the two-dimensional table 7 is moved horizontally as a unit with the table 9 which is movable in only one direction and raised and lowered relative to the table 9 for the sake of simplicity the table 9 shall be hereinafter called the one-dimensional table 9.

More specifically, the one-dimensional table 9 is engaged with a lateral screw shaft 11 which is supported on the framework F at both ends. The table 9 is slidable on a horizontal table guide 12, both ends of which are fixed to the framework F. When the motor 8, which is directly coupled to the lateral screw shaft 11, is activated in the forward direction, the table 9 moves horizontally to the right in the drawing. When the motor 8 is in the reverse direction, the table 9 moves horizontally to the left.

Four vertical screw shafts 13 (only two shown) are screw-engaged with the one-dimensional table 9, and the upper ends of the screw shafts 13 are shaft-supported by the two-dimensional table 7. Thus, the table 7 is supported by the one-dimensional table 9 via shafts 13. A chain-drive 14 is engaged with the shaft of the motor 10 and the four vertical screw shafts 13. When the motor 10 is activated in the forward direction, the two-dimensional table 7 is raised, and when the motor 10 is in the reverse direction, the table 7 is lowered.

The developing unit C is installed on the two-dimensional table 7. The unit C consists of a heating means 15, a roll brush contact type developing means 16, a roll brush contact type washing means 17 and a sponge roll contact vacuum type moisture-removing means 18. These components are installed so as to be parallel to the plate roll axis in such an order as described from the leading edge to the rear of the table 7 with respect to the order of process (heating, developing, washing and moisture removal) which the developing unit performs.

First, the heating means 15 is a far-infrared heater. It would be possible to use electrothermic heaters, hot draft heaters, etc.

The roll brush contact type developing means 16 includes a mini-tank 16a which stores developing solution (described below), a first roll brush 16b inside the mini-tank 16a, and a roll brush driving motor 16c which rotates the first roll brush 16b at a low speed and in the direction opposite from the rotational direction of the plate roll R.

The mini-tank 16a is supplied with an alkali developing solution. The solution is stored in a developing solution storage tank (not shown) provided outside the apparatus and supplied to the mini-tank 16a at an extremely small flow rate via a flexible pipe 16d by a metering delivery pump (not shown). The developing solution drips out of the mini-tank 16a at about the same small flow rate as fed in so that a fixed amount of developing solution is constantly kept in the mini-tank 16.

The first roll brush 16b is made of fine bristles which are soft and flexible. These bristles are implanted at high density so that the roll brush 16b has a "soft touch" so as not to damage the photosensitive film on the plate roll R. For example, bunches each consisting of 20 to 30 fine bristles made of nylon (of 30 to 40 microns diameter and 8 to 10 mm long) are implanted at a pitch of 1 to 2 mm in a fabric used for bristle implantation. In view of the replacement of the roll brush, a fabric with implanted bristles wrapped around a base roll is desirable for the first roll brush 16b.

The roll brush contact type washing means 17 has a second roll brush 17a which is composed in the same manner as the first roll brush 16b. The washing means 17 also has a water-supply nozzle 17b which can spray wash water onto the lower portion of the second roll brush 17a. Furthermore, the washing means 17 includes a mini-tank 17c for preventing the wash water from scattering. Thus, the mini-tank 17c surrounds the second roll brush 17a and the water-supplying nozzle 17b.

The roll brush driving motor 16c is used also to rotate the second roll brush 17a at a low speed in the direction opposite from the rotational direction of the plate roll R. The water-supply nozzle 17b is connected to an external water source (not shown) via flexible pipe 17d. Water in the mini-tank 17c is dripped out so that the water does not accumulate therein.

The sponge roll contact vacuum type moisture-removing means 18 includes a sponge roll 18a which is supported at both ends by a box-shape housing 18b so that the sponge roll 18a is freely rotated.

The sponge roll 18a is formed by fastening an annular sponge 18a" to a porous tube 18a, A suction pipe 18c is brought into the porous tube 18a, from one end thereof. The suction pipe 18c functions as a negative pressure generating means so as to bring the inside of the porous tube 18a, into a negative pressure.

The flexible pipe 18c is connected to a suction-port of a blower 18d, which is installed outside the apparatus, via a large-diameter flexible pipe 18e. A water-separate tube 18f is provided at suction port of the blower 18d and separates the water that flows through the flexible pipe 18e.

Reference numeral S1 is a first proximity switch which is installed in the vicinity of the heating means 15. The first proximity switch S1 detects the undersurface of the plate roll R so that the detection signal from the switch S1 is used as a signal that stops the raising action of the two-dimensional table 7.

With the detection signal, when the raising action of the two-dimensional table 7 is stopped, the first roll brush 16b and second roll brush 17a come into contact and are pressed against the photosensitive film of the plate roll R at an extremely small contact pressure, and the sponge roll 18a, which also comes into contact with the plate roll R, is kept at a predetermined contact pressure so that the sponge roll 18a is rotated by the rotation of the plate roll R.

A second proximity switch S2 is provided near the sponge roll 18a and detects the right-hand end of the plate roll R (in the drawing) so that the detection signal thereof causes the horizontal movement of the one-dimensional table 9 to stop.

The operation of the apparatus constructed as above will be described hereunder.

First, both ends of the undersurface of the plate roll R [that is to be made into a printing plate (on which desired information has been exposed following the coating of the roll surface with a photosensitive film)] are supported by a plate roll handling device, and the plate roll R is positioned horizontally between the fixed-side rotary chuck 1 and the movable-side rotary chuck 2.

then the air cylinder 6 is actuated to extend so that the plate roll R is securely held at both ends.

Next, a development starting switch (not shown) is turned ON. At this point, as shown in FIG. 1, the two-dimensional table 7 is in its left-most position, and the heating means 15 positions under the left-hand end of the horizontally held plate roll R.

Upon such a turning-on of the starting switch, the chuck-rotating motor 4 is activated, and the plate roll R is rotated at a predetermined speed in the direction shown by arrow X.

The roll brush driving motor 16c is activated, and the first roll brush 16b and second roll brush 17a are both rotated at a low speed in the direction shown by arrow Y. In other words, the brush rolls 16b and 17b are rotated in the opposite direction to the plate roll R.

In addition, a developing solution is supplied at an extremely small flow rate to the mini-tank 16a so that a predetermined amount of developing solution is kept in the mini-tank 16a, and wash water is sprayed onto the lower portion of the second roll brush 17a via the water-supply nozzle 17b. At the same time, a motor (not shown) for the blower 18d is activated so that the inside of the porous tube 18a, of the sponge roll 18a is brought into a negative pressure.

Next, the motor 10 is activated in the forward direction so as to raise the two-dimensional table 7. When the heating means 15 approaches the underside of one end (left end in the drawing) of the plate roll R, the raising movement of the two-dimensional table 7 is stopped. In other words, when the first proximity switch S1 detects the undersurface of the plate roll R, the motor 10 is stopped, so that the raising action of the two-dimensional table 7 is terminated. The heating means 15 then heats the plate roll R so that the setting reaction of the plate roll R after the exposure is promoted.

When the motor 10 is stopped as above, the motor 8 is driven in the forward direction. As a result, the one-dimensional table 9 starts moving slowly to the right (in the drawing). The heating means 15 moves to the right, starting the heating treatment onto the plate roll R. Then, the first roll brush 16b with its lower part immersed in the alkali developing solution comes into contact with the left end of the plate roll R and rotates while it is kept in contact with the plate roll R, thus applying the developing solution onto the plate roll. The alkali developing treatment is thus performed by the roll brush 16a.

Following to this alkali developing treatment, the second roll brush 17a comes into contact with the plate roll R. The roll brush 17a with its part immersed in or sprayed with the wash water and kept in contact with the plate roll R rotates so that the alkali developing solution and dissolved resists remaining on the roll plate R are washed off. Thus, the washing treatment is performed by the second roll brush 17a.

Then, the sponge roll 18a comes into contact with the plate roll R. The sponge roll 18a is pressed against the plate roll R and is thus rotated by the plate roll R while vacuuming is performed inside the sponge roll 18a. As a result, the wash water adhering to the plate roll is removed by suction. Thus, the drying treatment is performed by the sponge roll 18a.

The above treatments are successively performed on the entire surface of the plate roll R.

When the second proximity switch S2 detects the right-hand end of the plate roll R, the motor 8 is stopped. The motor 10 is driven in the reverse direction, and the two-dimensional table 7 is lowered. When the two-dimensional table 7 reaches its lowest position, the reverse driving of the motor 10 is stopped. After this, the motor 8 is driven in the reverse direction so that the two-dimensional table 7 is caused to move back horizontally (to the left in the drawing) to its original position. The driving of the chuck-rotating motor 4 is also stopped.

Both ends of the undersurface of the plate roll R are then supported by the plate roll handling device, and the air cylinder 6 is re-actuated so as to release the plate roll R. The plate roll R is then transferred to an etching device which is the next process for the thus treated plate roll, and one cycle of the developing process is completed.

Figure 4:
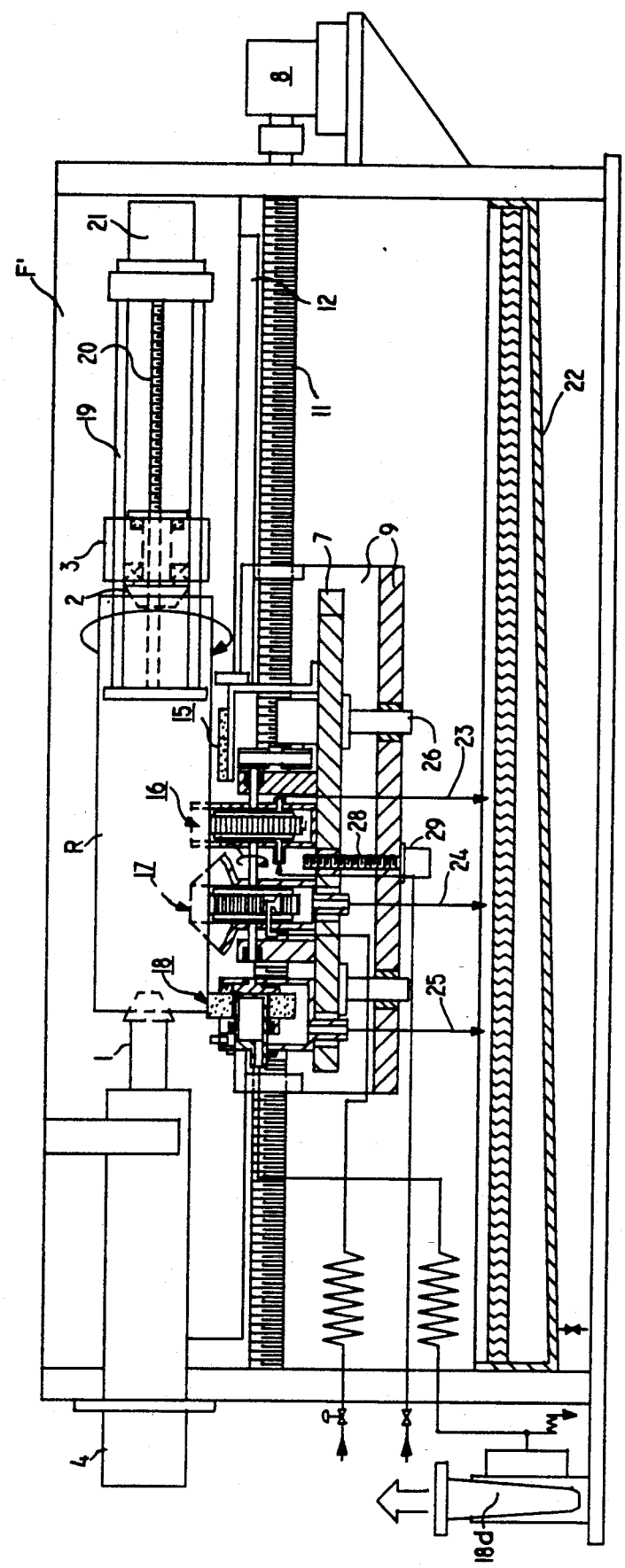
FIG. 4 is a longitudinal cross sectional front view of another type of moving-unit type developing apparatus of the present invention.

FIG. 4 shows second embodiment of the moving-unit type developing apparatus of the present invention. Explanation thereof will include only the elements which are different from the apparatus of the first embodiment:

The chuck-rotating motor 4 rotates the fixed-side rotary chuck 1. The movable-side rotary chuck 2 is rotatably supported on the movable bearing block 3 which is guided by a linear guide 19 and engaged with a screw shaft 20. The movable-side rotary chuck 2 is moved by a motor 21 that moves the movable bearing block 3. The motor 21 is directly coupled to the screw shaft 20. The linear guide 19, screw shaft 20 and motor 21 are installed in a cross-girder frame F'.

A drain pan 22 is installed underneath the area in which the one-dimensional table 9 is moved. The drain pan 22, connected to a waste water processing device (not shown), collects the developing solution drainage 23, wash water drainage 24 and sponge roll drainage 25.

The two-dimensional table 7 is supported on the one-dimensional table 9 by vertical guides 26 and an up-and-down screw 28. The vertical guides 26 consist of a plurality of shafts that extend downward from the two-dimensional table 7 and are slidably engaged with the one-dimensional table 9. The up-and-down screw 28 extends upward from the one-dimensional table 9 and screw-engages with the two-dimensional table 7. The two-dimensional table 7 is thus raised and lowered via a motor 29 which is installed on the one-dimensional table 9 and directly coupled to the up-and-down screw 28.

The operation of the apparatus of this embodiment is the same as that of the apparatus in the first embodiment except for the way to raising and lowering the table 7 and the way to collect the developing solution and wash water.

As is clear from the above description, according to the developing apparatus of the present invention, 1. A multi-treatment that consists of developing, washing and drying is automatically performed by a single unit of the developing unit C. Accordingly, the space required by the entire apparatus line is drastically reduced compared to the conventional system. Since only a single unit of apparatus is used, manufacturing costs can be greatly reduced. At the same time, high performance in the developing treatment is secured, and the processing time can be controlled easily. An etching treatment can be performed immediately after the multi-treatment.

2. The first roll brush removes the resist debris which has swelled to a sufficient softness during the process of resist image formation. Accordingly, the alkali developing solution is rubbed into newly exposed soft areas much more effectively. As a result of his rubbing-in action of the alkali developing solution rendered by the rubbing contact of the fine bristles, the fringe area can be kept as small values as approximately 2 to 3 microns compared to the conventional value which is approximately 10 microns.

3. Furthermore, according to the present invention that allows a multi-treatment consisting of pre-developing heating, developing, washing and drying, the multi-treatment can be performed immediately without any waiting period for the setting-reaction after the exposure that is required in the conventional methods.

I claim:

1. A moving-unit type developing method characterized in that:

a plate roll, which is to be made into a printing plate on which desired information has been exposed after coating surface of said roll with a photosensitive film, is chucked at both ends in a horizontal position and then caused to rotate at a predetermined speed; and a developing unit that comprises a roll brush contact type developing means, a roll brush contact type washing means, and a sponge roll contact vacuum type drying means, which are arranged in the order of treatment said developing unit performs, is moved from one end to the other of the under side of said plate roll, wherein an alkali developing treatment is performed by causing a first roll brush provided in said roll brush contact type developing means and immersed in an alkali developing solution to rotate in contact with said plate roll, said first roll brush being made of fine bristles of a predetermined softness implanted at a predetermined high density, and said rotation of said first roll brush being opposite in direction from rotation of said plate roll;

washing treatment for washing said alkali developing solution and dissolved resist adhering to said plate roll is performed by causing a second roll brush provided in said roll brush contact type washing means and immersed in wash water to rotate in contact with said plate roll, said second roll brush being made of fine bristles of a predetermined softness implanted at a predetermined high density, and rotation of said second roll brush being opposite in direction from rotation of said plate roll; and vacuum-removal treatment of wash water is performed by bringing a sponge roll provided in said sponge roll contact vacuum type drying means into contact with said plate roll so as to be rotated and vacuuming inside of said sponge roll to suction-remove said wash water adhering on said plate roll.

2. A moving-unit type developing method according to claim 1 characterized in that said method uses a developing unit further equipped with a heating means which is positioned in close proximity to said plate roll at the front of said roll brush contact type developing means with respect to the direction of treatment, so that said heating means heats up said plate roll to a predetermined temperature to accelerate a setting reaction of said photosensitive film after an exposure is performed and prior to said alkali developing treatment.

3. A moving-unit type developing apparatus characterized in that said apparatus comprises:
- a roll-chucking means which chucks a plate roll, that is to be made into a printing plate on which desired information has been exposed following the coating of the roll surface with a photosensitive film, at both ends in a horizontal position and rotates said plate roll at a predetermined speed,
- a table means equipped with a table which moves horizontally and vertically between a predetermined one point beneath said roll-chucking means and the other end thereof;
- a developing unit which is installed on said table and comprises a roll brush contact type developing means, a roll brush contact type washing means, and a sponge roll contact vacuum type moisture-removing means which are arranged in the order of treatments performed thereby along an axis of said plate roll from the front end of said developing unit; wherein,
- said roll brush contact type developing means has a first roll brush in which fine bristles are implanted at high density, said first roll brush being arranged so as to be immersed in an alkali developing solution which is stored inside a mini-tank;
- said roll brush contact type washing means has a second roll brush in which fine bristles are implanted at a high density, said roll brush contact type washing means being arranged so that wash water is supplied to said second roll brush from outside of said apparatus via a flexible hose, and
- said sponge roll contact vacuum type moisture-removing means has a rotatable sponge roll formed by installing an annular sponge on outside of a porous tube, said sponge roll contact vacuum type moisture-removing means being connected to a negative pressure generating means which brings inside of said sponge roll under a negative pressure; and
- when said is moved upward to a predetermined height in accordance with a diameter of said plate roll and moves horizontally along an undersurface of said plate roll;
- said first roll brush of said roll brush contact type developing means is rotated in an opposite direction from rotational direction of said plate roll so that said first roll brush rotates in contact with said plate roll and applies said alkali developing solution to said plate roll so as to perform an alkali developing treatment,
- said second brush of said roll brush contact type washing means is rotated in an opposite direction from rotational direction of said plate roll so that said alkali developing solution and dissolved resist remaining on developed areas of said plate roll are washed away, and
- said sponge roll of said sponge roll contact vacuum type moisture-removing means is brought into contact to said plate roll so as to be rotated thereby so that wash water adhering to said washed area of said plate roll is removed via suction.

4. A moving-unit type developing apparatus according to claim 3 characterized in that said developing unit further comprises a heating means which is installed in front of said roll brush contact type developing means with respect to a direction of treatment, and when said table is moved upward to a predetermined height in accordance with the diameter of said plate roll and moved horizontally along an undersurface of said plate roll, said heating means approaches said plate roll and heats said plate roll to a predetermined temperature which is capable of accelerating setting reaction of photosensitive film after exposure.

* * * * *